(12) United States Patent
Fan

(10) Patent No.: US 8,681,492 B2
(45) Date of Patent: Mar. 25, 2014

(54) FIXING DEVICE AND AN ELECTRONIC DEVICE USING THE SAME

(75) Inventor: Chin-Lung Fan, Taipei Hsien (TW)

(73) Assignee: Wistron Corporation, Taipei Hsien (TW)

( * ) Notice: Subject to any disclaimer, the term of this patent is extended or adjusted under 35 U.S.C. 154(b) by 142 days.

(21) Appl. No.: 13/398,125

(22) Filed: Feb. 16, 2012

(65) Prior Publication Data

US 2012/0287560 A1    Nov. 15, 2012

(30) Foreign Application Priority Data

May 13, 2011 (TW) .............................. 100116912 A

(51) Int. Cl.
*G06F 1/16* (2006.01)

(52) U.S. Cl.
USPC ............ 361/679.58; 361/679.02; 361/679.26; 361/679.27; 312/223.1; 312/223.2; 248/205.5; 248/206.2; 248/363

(58) Field of Classification Search
None
See application file for complete search history.

(56) References Cited

U.S. PATENT DOCUMENTS

| | | | | |
|---|---|---|---|---|
| 4,180,229 A | * | 12/1979 | Schulein | 248/363 |
| 5,964,437 A | * | 10/1999 | Belokin et al. | 248/205.5 |
| 6,152,414 A | * | 11/2000 | Jondrow | 248/346.03 |
| 7,850,133 B2 | * | 12/2010 | Carnevali | 248/205.5 |
| 7,876,552 B2 | * | 1/2011 | Guo | 361/679.07 |
| 7,913,963 B2 | * | 3/2011 | Cheng et al. | 248/205.5 |
| 8,199,496 B2 | * | 6/2012 | Liu et al. | 361/679.58 |

* cited by examiner

*Primary Examiner* — Anthony Q Edwards
(74) *Attorney, Agent, or Firm* — Muncy, Geissler, Olds & Lowe, P.C.

(57) ABSTRACT

A fixing device and an electronic device using the same are disclosed, wherein the fixing device is mounted in the electronic device's case for fixing the electronic device on a plane. The fixing device includes a suction cap, a cap cover, an elastic element, and a pressing element. The suction cap includes a suction section and a suction cap main body. The suction section has a suction surface and the body contains an accommodating area for accommodating the elastic element. The cover portion has a bottom part which is connected to a cover portion main body of the cap cover. The pressing element includes a pressing part and of which the shape matches the accommodating area. When the pressing element is pressed, the air flow within the accommodating area is blocked by the pressing part substantially.

20 Claims, 6 Drawing Sheets

FIXING DEVICE AND AN ELECTRONIC DEVICE USING THE SAME

BACKGROUND OF THE INVENTION

1. Field of the Invention

The present invention relates to a fixing device and an electronic device using the same; more particularly, the present invention relates to a fixing device for fixing an electronic device on a plane.

2. Description of the Related Art

Due to size limitation, there is no built-in fixing device for a laptop computer. A user has to use an additional fixing device to fix the laptop computer, such that the laptop computer can be fixed on the plane. However, this is very inconvenient and user unfriendly.

A suction cap is a common fixing device. However, in most conventional suction cap usage modes, the suction cap is fixed to a tabletop by means of changing the contact area between a suction surface and the tabletop, or changing the pressure between the suction surface and the tabletop, such that the external atmospheric pressure is greater than the atmosphere pressure between the suction surface and the tabletop. However, for such usage modes, it is required to apply a force to the suction cap in order to change the pressure or contact area between the suction surface and the tabletop, therefore this kind of suction caps need a comparatively larger working space, which is more difficult to be applied to laptop computers.

Therefore, there is a need to provide a fixing device and an electronic device mounted with the same to mitigate and/or obviate the aforementioned problems.

SUMMARY OF THE INVENTION

It is an object of the present invention to provide a fixing device for fixing an electronic device on a plane.

It is another object of the present invention to provide an electronic device having a fixing device.

To achieve the abovementioned objects, the present invention discloses a fixing device and an electronic device using the same. The fixing device is mounted in a case of the electronic device, and is used for fixing the electronic device on a plane. The fixing device comprises: a suction cap, an elastic element, a cover portion and a pressing element. The suction cap includes: a suction section and a suction cap main body, wherein the suction section has a suction surface, the suction cap main body is combined with the suction section, and the suction cap main body comprises an accommodating area. The elastic element is accommodated in the accommodating area. The cover portion includes: a bottom part and a cover portion main body, wherein the bottom part is arranged on the suction section, the cover portion main body is combined with the bottom part, and is arranged on the suction cap main body. When the pressing element is pressed, the bottom part would push against the suction section, such that the suction surface is contacted with the plane so as to squeeze out the air between the suction surface and the plane. The pressing element comprises a pressing part and of which the shape matches the accommodating area. When the pressing element is pressed, the pressing part substantially blocks the air flow from entering the accommodating area.

In one embodiment of the present invention, the pressing element comprises a button and the pressing part, and the button and the pressing part is combined as a whole.

BRIEF DESCRIPTION OF THE DRAWINGS

These and other objects and advantages of the present invention will become apparent from the following description of the accompanying drawings, which disclose several embodiments of the present invention. It is to be understood that the drawings are to be used for purposes of illustration only, and not as a definition of the invention.

In the drawings, wherein similar reference numerals denote similar elements throughout the several views.

DETAILED DESCRIPTION OF THE PREFERRED EMBODIMENT

Figure 1:
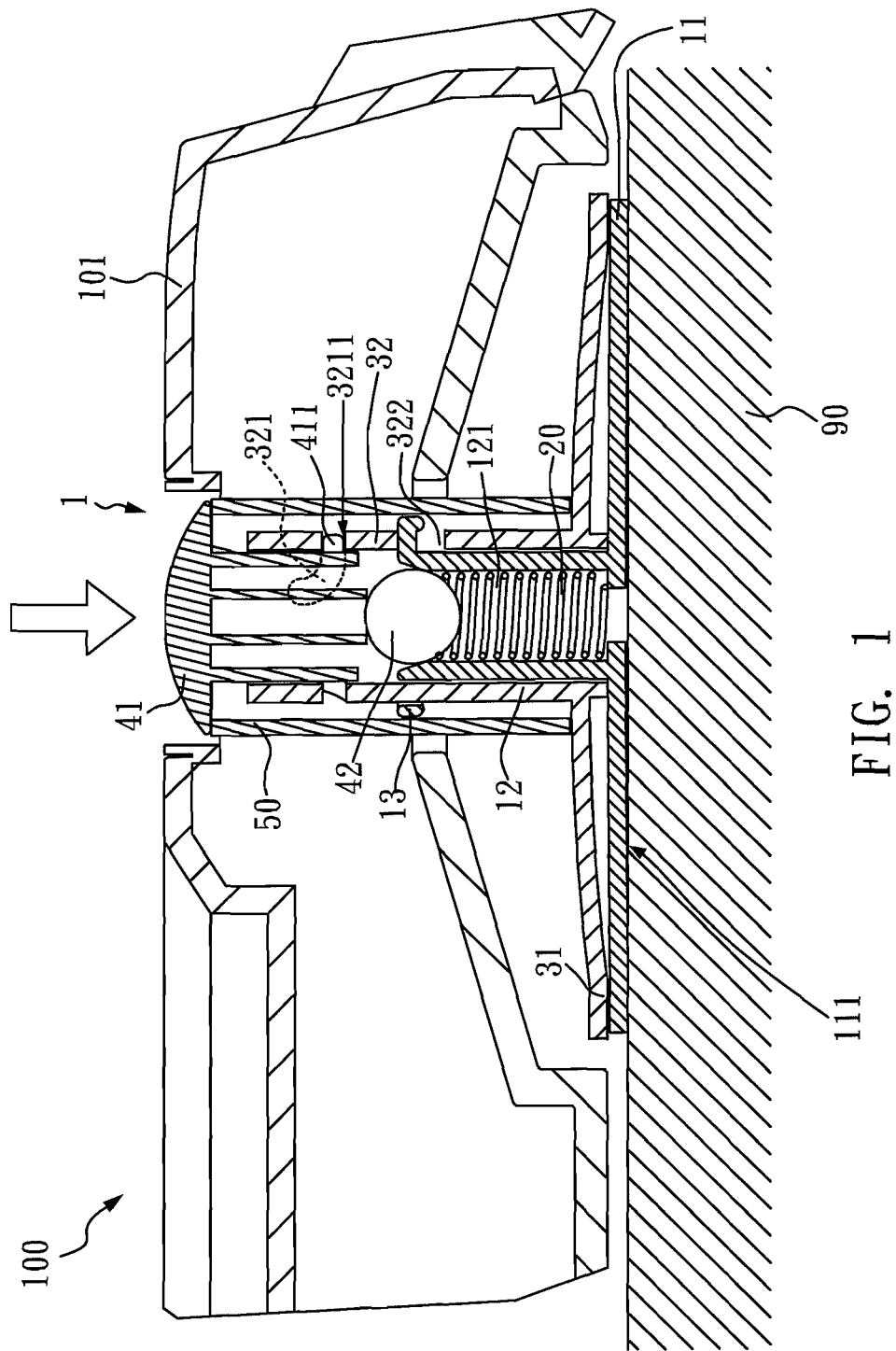
FIG. 1 illustrates a cross sectional schematic drawing of an electronic device and its fixing device when the fixing device is at a pressed position according to the present invention.
Figure 2:
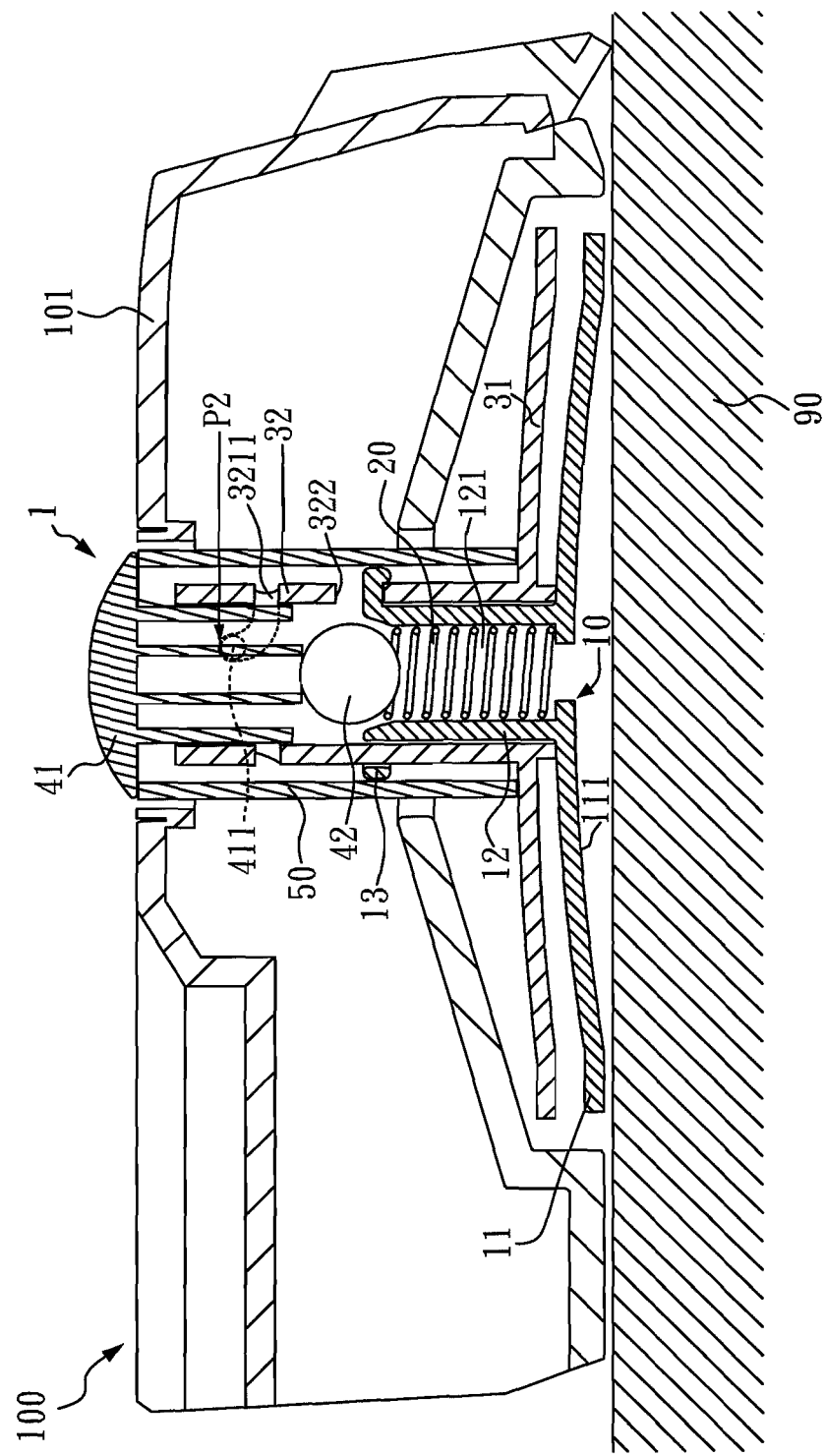
FIG. 2 illustrates a cross sectional schematic drawing of the electronic device and the fixing device when the fixing device is not at the pressed position according to the present invention.
Figure 3:
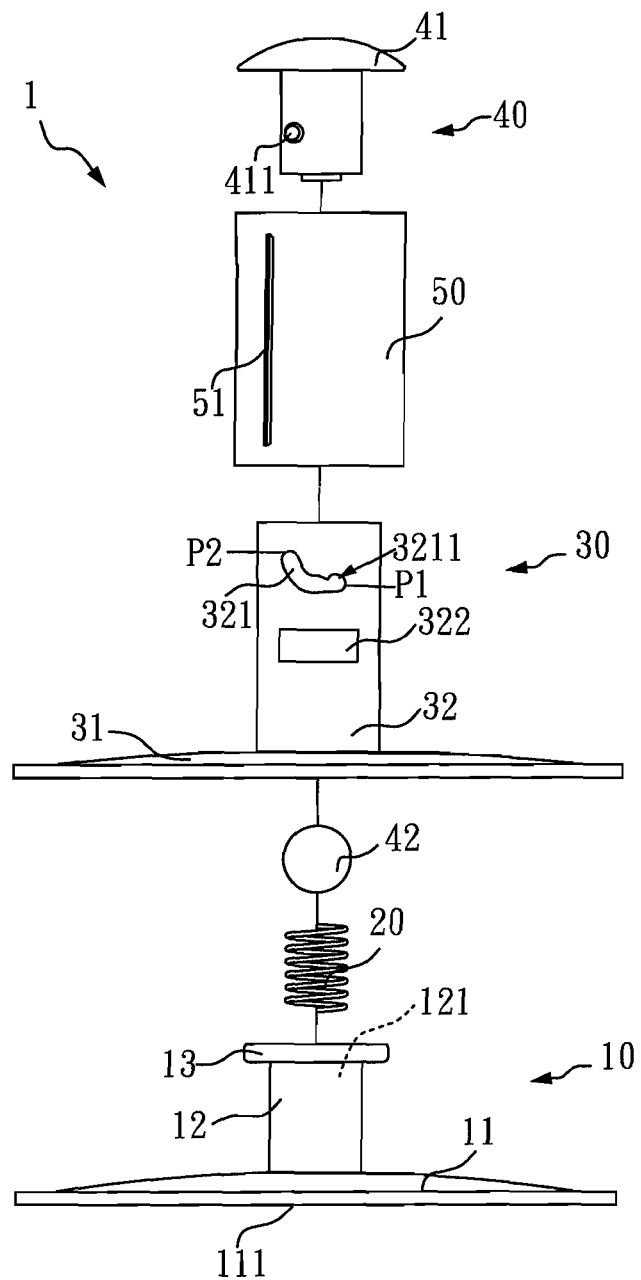
FIG. 3 illustrates an exploded schematic view of the fixing device according to a second embodiment of the present invention.
Figure 4:
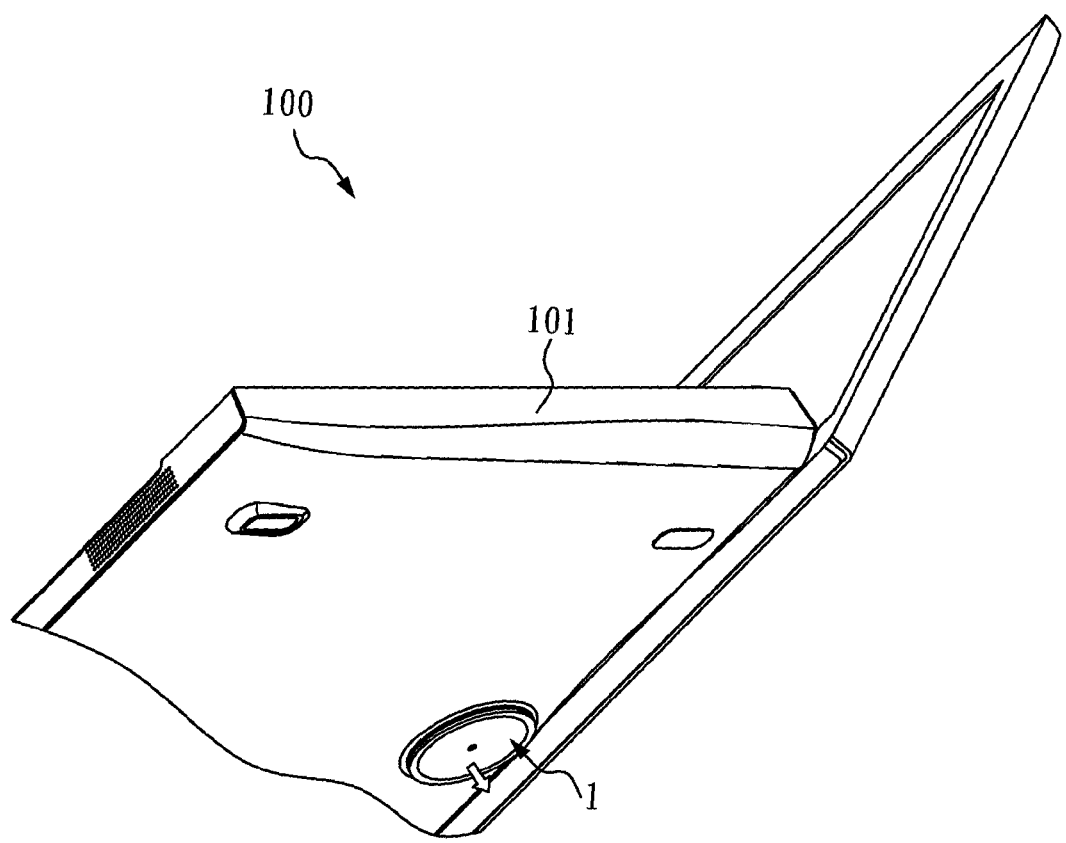
FIG. 4 illustrates a schematic drawing of a bottom surface of the electronic device and the fixing device when the fixing device is at the pressed position according to the present invention.
Figure 5:
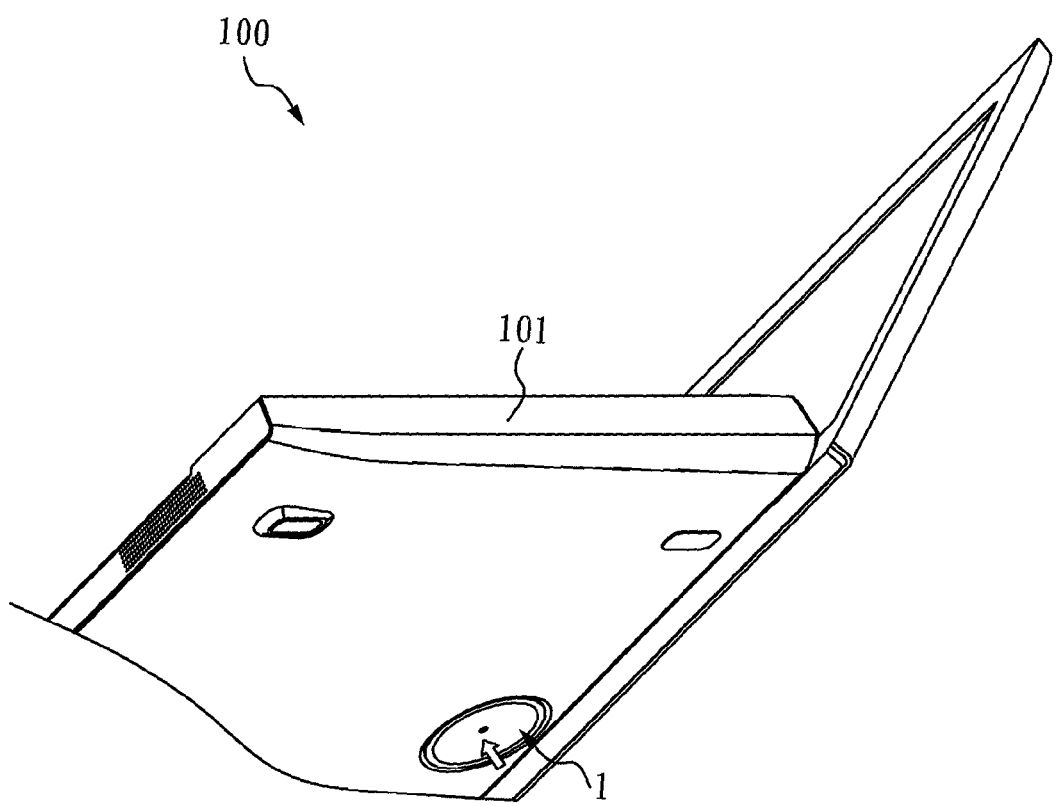
FIG. 5 illustrates a schematic drawing of the bottom surface of the electronic device and the fixing device when the fixing device is not at the pressed position according to the present invention.

Please refer to FIGS. 1 to 5, which are related to an electronic device and its fixing device according to a first embodiment of the present invention. FIG. 1 illustrates a cross sectional schematic drawing of the electronic device and its fixing device when the fixing device is at a pressed position; FIG. 2 illustrates a cross sectional schematic drawing of the electronic device and the fixing device when the fixing device is not at the pressed position; FIG. 3 illustrates an exploded schematic view of the fixing device; FIG. 4 illustrates a schematic drawing of a bottom surface of the electronic device and the fixing device when the fixing device is at the pressed position; and FIG. 5 illustrates a schematic drawing of the bottom surface of the electronic device and the fixing device when the fixing device is not at the pressed position.

As shown in FIG. 1 and FIG. 2, in one embodiment of the present invention, the fixing device 1 of the present invention passes through a case 101 of the electronic device 100, and is mounted in the case 101, so as to fix the electronic device 100 on a plane 90. As shown in FIG. 3, the fixing device 1 of the present invention comprises a suction cap 10, an elastic element 20, a cover portion 30, a pressing element 40 and a sleeve element 50. The suction cap 10 comprises a suction section 11, a suction cap main body 12 and a top part 13. The cover portion 30 comprises a bottom part 31 and a cover portion main body 32. The pressing element 40 comprises a button 41 and a pressing part 42. The sleeve element 50 comprises a notch 51.

As shown in FIGS. 1 to 3, the suction section 11 is approximately a disc-shaped object, and the suction section 11 has a suction surface 111. The suction cap main body 12 is approximately a hollow cylindrical object, and comprises an accommodating area 121 as a non-limiting example. The top part 13 is approximately a flange. The suction cap main body 12 is located above the suction section 11, and the top part 13 is located above the suction cap main body 12. The suction section 11, the suction cap main body 12 and the top part 13 are combined as a whole, but please note the scope of the present invention is not limited to the above description. The accommodating area 121 is capable of accommodating the elastic element 20. The elastic element 20 of the present invention is, but not limited to, a spring. As shown in FIG. 1, when the elastic element 20 is pressed, the suction section 11 of the suction cap 10 would be pushed, such that the suction surface 111 would be contacted with the plane 90.

As shown in FIGS. 1 to 3, the cover portion 30 is arranged on the suction cap 10. The bottom part 31 of the cover portion 30 is approximately a disc-shaped object, and the cover portion main body 32 is approximately a hollow cylindrical object. The cover portion main body 32 is located above the bottom part 31, and is combined with the bottom part 31 as a whole, but please note the scope of the present invention is not limited to the above description. The cover portion main body 32 comprises a guide slot 321 and a connection slot 322. The guide slot 321 is approximately a curve-shaped opening, and comprises a first end P1, a second end P2 and a position limiting area 3211, wherein the position limiting area 3211 is located close to one side of the first end P1. In this embodiment, the location of the first end P1 is lower than the location of the second end P2. The connection slot 322 is approximately a rectangular opening, and is capable of accommodating the top part 13 of the suction cap 10, so as to combine the cover portion 30 with the suction cap 10.

The pressing element 40 comprises the button 41 and the pressing part 42, wherein the button 41 is located above the pressing part 42. The pressing part 42 is approximately a spherical ball as a non-limiting example. The button 41 comprises a guide pin 411. The guide pin 411 is accommodated in the guide slot 321, and is capable of moving within the guide slot 321. When the button 41 is pressed and therefore moves downwards, the guide pin 411 would be driven to move between the first end P1 and the second end P2 of the guide slot 321. When the guide pin 411 moves to the first end P1, the guide pin 411 would be held within the position limiting area 3211, and at this time the suction cap 10 is contacted with the plane 90 (as shown in FIG. 1). When the guide pin 411 leaves the position limiting area 3211 and moves to the second end P2, the suction cap 10 is departed from the plane 90 (as shown in FIG. 2). Therefore, according to the cooperation between the guide slot 321 and the guide pin 411, the moving process of the button 41 can be controlled.

When the button 41 is pressed and therefore moves downwards to make the guide pin 411 reach the first end P1 of the guide slot 321, the guide pin 411 would be held within the position limiting area 3211, such that the button 41 would stop moving. At this time, the pressing part 42 would push against the elastic element 20, such that the elastic element 20 would push against the suction section 11 of the suction cap 10; meanwhile, the cover portion 30 would move downwards to push against the suction section 11 of the suction cap 10. Therefore, the suction surface 111 would be contacted with the plane 90, so as to squeeze out the air between the suction surface 111 and the plane 90. At this time, as shown in FIG. 1, part of the ball body of the pressing part 42 would substantially block the air flow from entering the accommodating area 121 of the suction cap main body 12, so as to avoid adhesion degradation. As a result, the force for adhering the suction cap 10 to the plane 90 can be kept, such that the suction surface 111 can be stably fixed to the plane 90. Please note that the pressing part 42 can be an element of any shape as long as it can block the accommodating area 121 to achieve the object of blocking the air flow from entering the suction cap 10.

As shown in FIGS. 1 to 3, the sleeve element 50 is approximately a hollow cylindrical object as a non-limiting example. The sleeve element 50 is arranged on the cover portion 30 and the suction cap 10. The sleeve element 50 is combined with the case 101 via the notch 51, such that the fixing device 1 can be stably combined with the case 101. As shown in FIG. 1, when the button 41 is pressed and therefore moves downwards, the button 41 would drive the sleeve element 50 to push against the cover portion 30, such that the cover portion 30 would push against the suction section 11, and therefore the suction surface 111 would be contacted with the plane 90, so as to squeeze out the air between the suction surface 111 and the plane 90.

When the fixing device 1 of the present invention needs departing from the plane 90, the button 41 needs to be rotated so as to make the guide pin 411 leave the position limiting area 3211. At this time, the button 41 moves upwards to the second end P2 of the guide slot 321, the pressing part 42 is departed from the cover portion main body 32, and the elastic element 20 is recovered (as shown in FIG. 2). At this time, the cover portion 30 is not contacted with the suction cap 10, and the air flow would enter the suction cap 10 via the accommodating area 121, so as to release the adhesion between the suction surface 111 and the plane 90, such that the suction cap 10 can leave the plane 90.

Further, as shown in FIG. 1 and FIG. 4, when the fixing device 1 of the present invention is pressed, part of the suction cap 10 of the fixing device 1 would be protruded from the electronic device 100. The height of the protrusion is approximately the same as or slightly higher than the height of the footpad generally installed in the bottom of the electronic device 100. Therefore, the fixing device 1 of the present invention not only can fix the electronic device 100, but also can replace the footpad generally installed in the bottom of the electronic device 100. Moreover, as shown in FIG. 2 and FIG. 5, when the fixing device 1 of the present invention is not pressed, part of the button 41 of the fixing device 1 would be protruded from the case 101 of the electronic device 100 for facilitating a user to press the button 41. And the suction cap 10 and the cover portion 30 would be retracted in the electronic device 100. Please note the scope of the present invention is not limited to the above description, the button 41 and the case 101 can be positioned at the same level as well.

Figure 6:
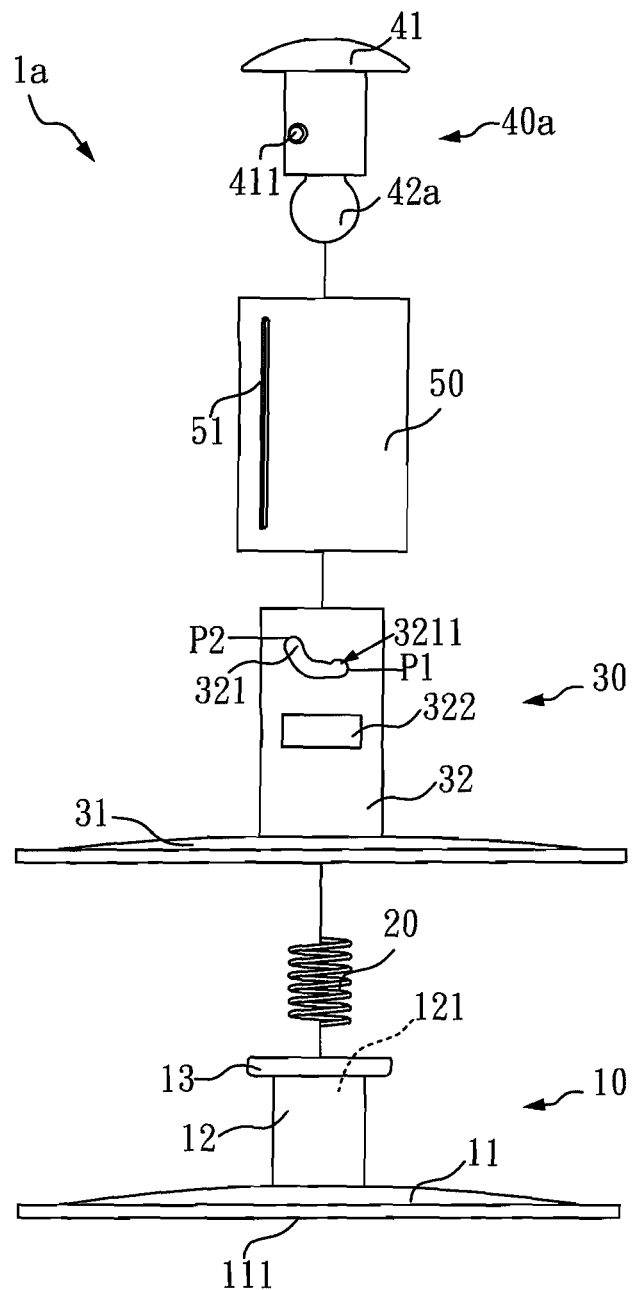
FIG. 6 illustrates an exploded schematic view of the fixing device according to a second embodiment of the present invention.

Please refer to FIG. 6, which is related to the electronic device and its fixing device according to a second embodiment of the present invention. FIG. 6 illustrates an exploded schematic view of the fixing device according to a second embodiment of the present invention.

The major difference between the fixing device 1a of the second embodiment and the fixing device 1 is: the button 41 and the pressing part 42a of the pressing element 40a the fixing device 1a of the present invention are combined as a whole, wherein the pressing part 42a is curve-shaped as a non-limiting example. The pressing part 42a is not limited to curve-shaped, the pressing part 42 can be an element of any shape as long as it can block the accommodating area 121 to achieve the object of blocking the air flow from entering the suction cap 10. The operation process of the fixing device 1a is the same as the operation process of the fixing device 1, therefore there is no need for further description.

Although the present invention has been explained in relation to its preferred embodiments, it is to be understood that many other possible modifications and variations can be made without departing from the spirit and scope of the invention as hereinafter claimed.

What is claimed is:

1. A fixing device, mounted in a case of an electronic device, and used for fixing the electronic device on a plane, the fixing device comprising:
 a suction cap, comprising:
  a suction section, having a suction surface; and
  a suction cap main body, combined with the suction section, wherein the suction cap main body comprises an accommodating area;
 an elastic element, accommodated in the accommodating area;
 a cover portion, comprising:
  a bottom part, arranged on the suction section; and
  a cover portion main body, combined with the bottom part, and arranged on the suction cap main body; and
 a pressing element, wherein when the pressing element is pressed, the bottom part pushes against the suction section, such that the suction surface is contacted with the plane so as to squeeze out the air between the suction surface and the plane, wherein the pressing element comprises a pressing part of which the shape matches the accommodating area, and when the pressing element is pressed, the pressing part substantially blocks the air flow from entering the accommodating area, wherein the pressing element comprises a button, and when the button is not pressed, the suction cap and the cover portion is located within the electronic device.

2. The fixing device as claimed in claim 1, wherein when the button is pressed, at least one part of the suction cap is protruded from the electronic device.

3. The fixing device as claimed in claim 2, wherein the button and the pressing part are integrated into one body.

4. The fixing device as claimed in claim 1, further comprising a sleeve element combined with the case, wherein the sleeve element is arranged on the cover portion and the suction cap, when the pressing element is pressed, the pressing element pushes against the sleeve element, such that the sleeve element pushes against the cap cover, and therefore the bottom part pushes against the suction section.

5. The fixing device as claimed in claim 4, wherein when the button is pressed, at least one part of the suction cap is protruded from the electronic device.

6. The fixing device as claimed in claim 5, wherein the button and the pressing part are integrated into one body.

7. The fixing device as claimed in claim 1, wherein the suction cap comprises a top part, the top part is approximately a flange, the cover portion main body comprises a connection slot capable of accommodating the top part, so as to combine the cover portion with the suction cap.

8. The fixing device as claimed in claim 1, wherein the cover portion main body comprises a guide slot, the pressing element comprises a guide pin, and the guide pin is accommodated in the guide slot for moving within the guide slot.

9. The fixing device as claimed in claim 8, wherein the guide slot is curve-shaped and comprises a first end, a second end and a position limiting area, where the position limiting area is located close to one side of the first end; when the guide pin moves to the first end, the guide pin is held within the position limiting area, and the suction cap is contacted with the plane; when the guide pin leaves the position limiting area and moves to the second end, the suction cap is departed from the plane.

10. An electronic device, comprising:
 a case; and
 a fixing device, mounted in the case, and used for fixing the electronic device on a plane, the fixing device comprising:
  a suction cap, comprising:
   a suction section, having a suction surface; and
   a suction cap main body, combined with the suction section, wherein the suction cap main body comprises an accommodating area;
  an elastic element, accommodated in the accommodating area;
  a cap cover, comprising:
   a bottom part, arranged on the suction section; and
   a cover portion main body, combined with the bottom part, and arranged on the suction cap main body; and
  a pressing element, wherein when the pressing element is pressed, the bottom part pushes against the suction section, such that the suction surface is contacted with the plane so as to squeeze out the air between the suction surface and the plane, where the pressing element comprises a pressing part of which the shape matches the accommodating area, and when the pressing element is pressed, the pressing part substantially blocks the air flow from entering the accommodating area; wherein the pressing element comprises a button, and when the button is not pressed, the suction cap and the cover portion is located within the electronic device.

11. The electronic device as claimed in claim 10, wherein when the button is pressed, at least one part of the suction cap is protruded from the electronic device.

12. The electronic device as claimed in claim 11, wherein the button and the pressing part are integrated into one body.

13. The electronic device as claimed in claim 10, further comprising a sleeve element combined with the case, wherein the sleeve element is arranged on the cover portion and the suction cap, when the pressing element is pressed, the pressing element pushes against the sleeve element, such that the sleeve element pushes against the cap cover, and therefore the bottom part pushes against the suction section.

14. The electronic device as claimed in claim 13, wherein when the button is pressed, at least one part of the suction cap is protruded from the electronic device.

15. The electronic device as claimed in claim 14, wherein the button and the pressing part are integrated into one body.

16. The electronic device as claimed in claim 10, wherein the suction cap comprises a top part, the top part is approximately a flange, the cover portion main body comprises a connection slot capable of accommodating the top part, so as to combine the cover portion with the suction cap.

17. The electronic device as claimed in claim 10, wherein the cover portion main body comprises a guide slot, the pressing element comprises a guide pin, and the guide pin is accommodated in the guide slot for moving within the guide slot.

18. The electronic device as claimed in claim 17, wherein the guide slot is curve-shaped and comprises a first end, a second end and a position limiting area, where the position limiting area is located close to one side of the first end; when the guide pin moves to the first end, the guide pin is held within the position limiting area, and the suction cap is contacted with the plane; when the guide pin leaves the position limiting area and moves to the second end, the suction cap is departed from the plane.

19. A fixing device, mounted in a case of an electronic device, and used for fixing the electronic device on a plane, the fixing device comprising:
 a suction cap, comprising:
  a suction section, having a suction surface; and a suction cap main body, combined with the suction section, wherein the suction cap main body comprises an accommodating area;
an elastic element, accommodated in the accommodating area;
a cover portion, comprising:
   a bottom part, arranged on the suction section; and
   a cover portion main body, combined with the bottom part, and arranged on the suction cap main body; the cover portion main body comprising a guide slot which is curve-shaped and comprises a first end, a second end and a position limiting area, where the position limiting area is located close to one side of the first end; and
a pressing element, wherein when the pressing element is pressed, the bottom part pushes against the suction section, such that the suction surface is contacted with the plane so as to squeeze out the air between the suction surface and the plane, wherein the pressing element comprises a pressing part of which the shape matches the accommodating area, and when the pressing element is pressed, the pressing part substantially blocks the air flow from entering the accommodating area; the pressing element comprises a guide pin, and the guide pin is accommodated in the guide slot for moving within the guide slot, wherein when the guide pin moves to the first end, the guide pin is held within the position limiting area, and the suction cap is contacted with the plane; when the guide pin leaves the position limiting area and moves to the second end, the suction cap is departed from the plane.

20. An electronic device, comprising:
a case; and
a fixing device, mounted in the case, and used for fixing the electronic device on a plane, the fixing device comprising:
   a suction cap, comprising:
      a suction section, having a suction surface; and
      a suction cap main body, combined with the suction section, wherein the suction cap main body comprises an accommodating area;
   an elastic element, accommodated in the accommodating area;
   a cap cover, comprising:
      a bottom part, arranged on the suction section; and
      a cover portion main body, combined with the bottom part, and arranged on the suction cap main body; the cover portion main body comprising a guide slot which is curve-shaped and comprises a first end, a second end and a position limiting area, where the position limiting area is located close to one side of the first end; and
   a pressing element, wherein when the pressing element is pressed, the bottom part pushes against the suction section, such that the suction surface is contacted with the plane so as to squeeze out the air between the suction surface and the plane, where the pressing element comprises a pressing part of which the shape matches the accommodating area, and when the pressing element is pressed, the pressing part substantially blocks the air flow from entering the accommodating area; wherein the pressing element comprises a guide pin, and the guide pin is accommodated in the guide slot for moving within the guide slot, wherein when the guide pin moves to the first end, the guide pin is held within the position limiting area, and the suction cap is contacted with the plane; when the guide pin leaves the position limiting area and moves to the second end, the suction cap is departed from the plane.

\* \* \* \* \*